US007157203B2

(12) United States Patent

Kimura

(10) Patent No.: US 7,157,203 B2
(45) Date of Patent: Jan. 2, 2007

(54) IMAGE FORMING METHOD AND IMAGE FORMING APPARATUS FOR PLANOGRAPHIC PRINTING PLATE

(75) Inventor: Akinori Kimura, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/951,677

(22) Filed: Sep. 29, 2004

(65) Prior Publication Data

US 2005/0068414 A1 Mar. 31, 2005

(30) Foreign Application Priority Data

Sep. 29, 2003 (JP) ............................ 2003-336722

(51) Int. Cl.
*G03F 7/20* (2006.01)
*G03F 7/30* (2006.01)
*G03F 7/40* (2006.01)

(52) U.S. Cl. ...................... 430/138; 430/302; 430/328; 430/330; 430/964

(58) Field of Classification Search ................ 430/302, 430/330, 328, 138, 964
See application file for complete search history.

(56) References Cited

U.S. PATENT DOCUMENTS 6,022,667 A * 2/2000 Vermeersch et al. ..... 430/271.1
6,096,481 A * 8/2000 Vermeersch et al. ........ 430/302
6,165,690 A * 12/2000 Yoshida et al. ............. 430/302
6,391,516 B1 * 5/2002 Vermeersch et al. ..... 430/270.1
6,946,231 B1 * 9/2005 Makino ...................... 430/138
2001/0018159 A1 * 8/2001 Maemoto .................... 430/138
2002/0168582 A1 * 11/2002 Vermeersch et al. ..... 430/270.1
2002/0172888 A1 * 11/2002 Huang et al. ............ 430/270.1
2003/0200886 A1 * 10/2003 Vermeersch et al. ........ 101/467

FOREIGN PATENT DOCUMENTS

JP 2938397 B2 6/1999
JP 2001-277740 A 10/2001
JP 2001-277742 A 10/2001

* cited by examiner

*Primary Examiner*—Richard L. Schilling
(74) *Attorney, Agent, or Firm*—Sughrue Mion, PLLC

(57) ABSTRACT

The present invention is to provide an image forming method for a planographic printing plate. In the method, a planographic printing plate precursor in which an image recording layer containing a thermally sensitive and thermally curable material is formed on an aluminium support is scanning exposed with a relatively weak laser beam, and a latent image is formed, which is composed of an image recording layer part whose surface layer is thermally cured corresponding to an image and an unexposed image recording layer part which is not thermally cured. The unexposed image recording layer part which is not thermally cured is then removed by simple water development. Then, by carrying out heating, the whole image recording layer part remaining on the surface of the aluminum support is uniformly cured and firmly fixed. The invention also provides an image forming apparatus for a planographic printing plate.

7 Claims, 5 Drawing Sheets

IMAGE FORMING METHOD AND IMAGE FORMING APPARATUS FOR PLANOGRAPHIC PRINTING PLATE

CROSS-REFERENCE TO RELATED APPLICATION

This application claims priority under 35 USC 119 from Japanese Patent Application No. 2003-336722, the disclosure of which is incorporated by reference herein.

BACKGROUND OF THE INVENTION

The present invention relates to an image forming method and a image forming apparatus for a planographic printing plate in which developing and plate-making are carried out after exposing a precursor of the planographic printing plate to a laser beam.

DESCRIPTION OF THE RELATED ART

Generally, a photosensitive planographic printing plate (a so-called PS plate) is used for offset printing. In the field of planographic printing, a planographic printing plate used for a CTP (Computer to Plate) system which directly makes a printing plate by performing laser exposure treatment based on digital data of a computer or the like, has been proposed.

Conventionally, an on press development system which is attached to a printer and prints without developing after exposing the planographic printing plate precursor has been proposed in the CTP system.

In the on press development system, a planographic printing plate precursor is used in which an aluminum flat plate having a hydrophilic surface which is anodized and is made coarse is used as a support, an image forming layer containing hydrophobic thermoplastic polymer particles which can be fused under the influence of heat and are dispersed in a hydrophilic binder is formed on the hydrophilic surface, and a compound converting light-to-heat is included in the image forming layer or a layer which is adjacent to the image forming layer.

In the on press development system, the planographic printing plate precursor is exposed by using, for example, laser light (light emitted from an LED or laser diode) in a wavelength range of infrared (IR) region or the near-infrared region.

In the exposure treatment performed on the planographic printing plate precursor, the laser light irradiated on the image forming layer corresponding to a desired image is converted into heat, a hydrophobic conglomerate is generated in the hydrophilic layer by heating the hydrophobic thermoplastic polymer particles contained in the image forming layer to a temperature equal to or greater than a solidification temperature thereof, and solidifying the same, and the hydrophilic layer is made insoluble in ordinary water or an aqueous liquid.

In the on press development system, for instance, the exposed planographic printing plate is arranged, for example, on a printing cylinder of a printer. Next, the printer is started, and a dampening agent roller for supplying an aqueous dampening liquid is rollingly contacted on the image forming layer of the planographic printing plate. In addition, by rollingly contacting the ink roller on the image forming layer of the planographic printing plate and printing, the hydrophobic conglomerate solidified on the image forming layer of the planographic printing plate is left, and the other portions of the hydrophilic layer are dissolved in ordinary water or an aqueous liquid and removed to perform development. After about ten rotations of the cylinder, the first clear and useful print is usually obtained (for instance, see Japanese Patent No. 2938397).

In the conventional on press development system, a metal plate such as aluminium is used as a support of the planographic printing plate. In addition, when the laser exposure treatment is performed, it is possible to heat sufficiently to a temperature equal to or greater than the solidification temperature by laser light irradiated on high power within the range in which ablation (phenomenon in which the irradiated part is burned by strong energy) is not caused in the vicinity of the upper surface in thickness direction of the layer in the image forming layer of the planographic printing plate.

However, heat energy converted from the irradiated laser light diffuses rapidly to the side of the support, which has high thermal conductivity, in the vicinity of the lower surface in thickness direction of the layer in the image forming layer. Therefore, even if the laser light is irradiated at the maximum power at which no ablation is caused, the temperature does not sufficiently increase to a temperature equal to or greater than the solidification temperature in the vicinity of the interface between the support and image forming layer (thermal sensitive recording layer). As a result, the image forming layer part (image part) on which the laser light is irradiated is not sufficiently cured, and the strength of the image part is insufficient. Therefore, a problem exists in that in the thus-obtained planographic printing plate, the image part tend to become lacking along with an increase in the number of pages printed during printing, and is inferior in printing durability.

SUMMARY OF THE INVENTION

The present invention provides an image forming method for a planographic printing plate in which exposure treatment can be performed by irradiating laser light at comparatively low power and which can improve the printing durability. The present invention also provides an image forming apparatus for a planographic printing plate.

One aspect of the invention is to provide an image forming method for a planographic printing plate in which an image recording layer containing a thermally sensitive and thermally curable material is formed on an aluminum support, the method comprising: an exposure step of scanning exposing a planographic printing plate precursor with a laser beam so as to form a latent image in the image recording layer; a simplified water development step of leaving an image recording layer part in which at least a surface layer thereof has been thermally cured by exposure and removing an unexposed image recording layer part which has not been thermally cured, in the planographic printing plate in which the latent image has been formed, and a heating step of heating the planographic printing plate after the simplified water development step such that the image recording layer part remaining on the surface of the aluminum support is uniformly cured and firmly fixed to the surface of the aluminum support.

According to above-described structure, since at least only the surface layer of the image recording layer can be cured to extent that the surface layer is not removed by the later developing treatment in the exposure process, the surface layer can be exposed at relatively weak amount of laser power below an amount of laser power at which ablation is caused, the laser light source device can easily be produced at low cost, and the recording speed can be increased as compared with conventional recording speeds. The image recording layer part left on the surface of the planographic printing plate is heated by the heating treatment in the heat treatment process, whereby the lower part of the image recording layer can be cured, and the image recording layer can be firmly fixed to the surface of the support. In addition, since the whole image recording layer is heated in the thickness direction and is homogeneously cured, printing durability can be improved when the planographic printing plate is used for printing.

Another aspect of the invention is to provide an image forming apparatus for a planographic printing plate in which an image recording layer containing a thermally sensitive and thermally curable material is formed on an aluminum support, the apparatus comprising: a developing part carrying therein the planographic printing plate having formed therein a latent image composed of an image recording layer part in which at least a surface layer thereof has been thermally cured by exposure and an unexposed image recording layer part which has not been thermally cured, and performing a simplified water development process of leaving the image recording layer part in which at least the surface layer thereof has been thermally cured by exposure and removing the unexposed image recording layer part which has not been thermally cured; and a heating part, into which the planographic printing plate developed by the developing part is introduced, for heating the planographic printing plate such that the image recording layer part remaining on the surface of the aluminum support is uniformly cured and firmly fixed to the surface of the aluminum support.

According to the above-describe structure, the surface of the planographic printing plate is exposed by the developing treatment in the developing part, and only the image recording layer part in which at least the surface thereof has been cured remains. Since the heating part for heating the developed planographic printing plate heats the image formed on the surface of the planographic printing plate uniformly regardless of the shape thereof, various heating means other than means for heating by laser light can be used, and the device of the heating part can be simply constructed at low cost. In the planographic printing plate obtained by heating in the heating part after developing in the developing part, the image recording layer part formed on the surface of the planographic printing plate corresponding to the image is heat-cured to the lower layer part thereof, and is firmly fixed on the surface of the support. The whole image recording layer part is homogeneously cured along the thickness direction, whereby the printing durability when the planographic printing plate is used for printing can be improved.

According to the image forming method and the image forming apparatus for a planographic printing plate of the invention, the exposure treatment can be performed by irradiating laser light at comparatively low power, and printing durability can be improved.

DETAILED DESCRIPTION OF THE INVENTION

Hereinbelow, an image forming method and an image forming apparatus for a planographic printing plate of the embodiment of the present invention will be described with reference to FIGS. 1 to 7.

[Image Forming Apparatus]

Figure 1:
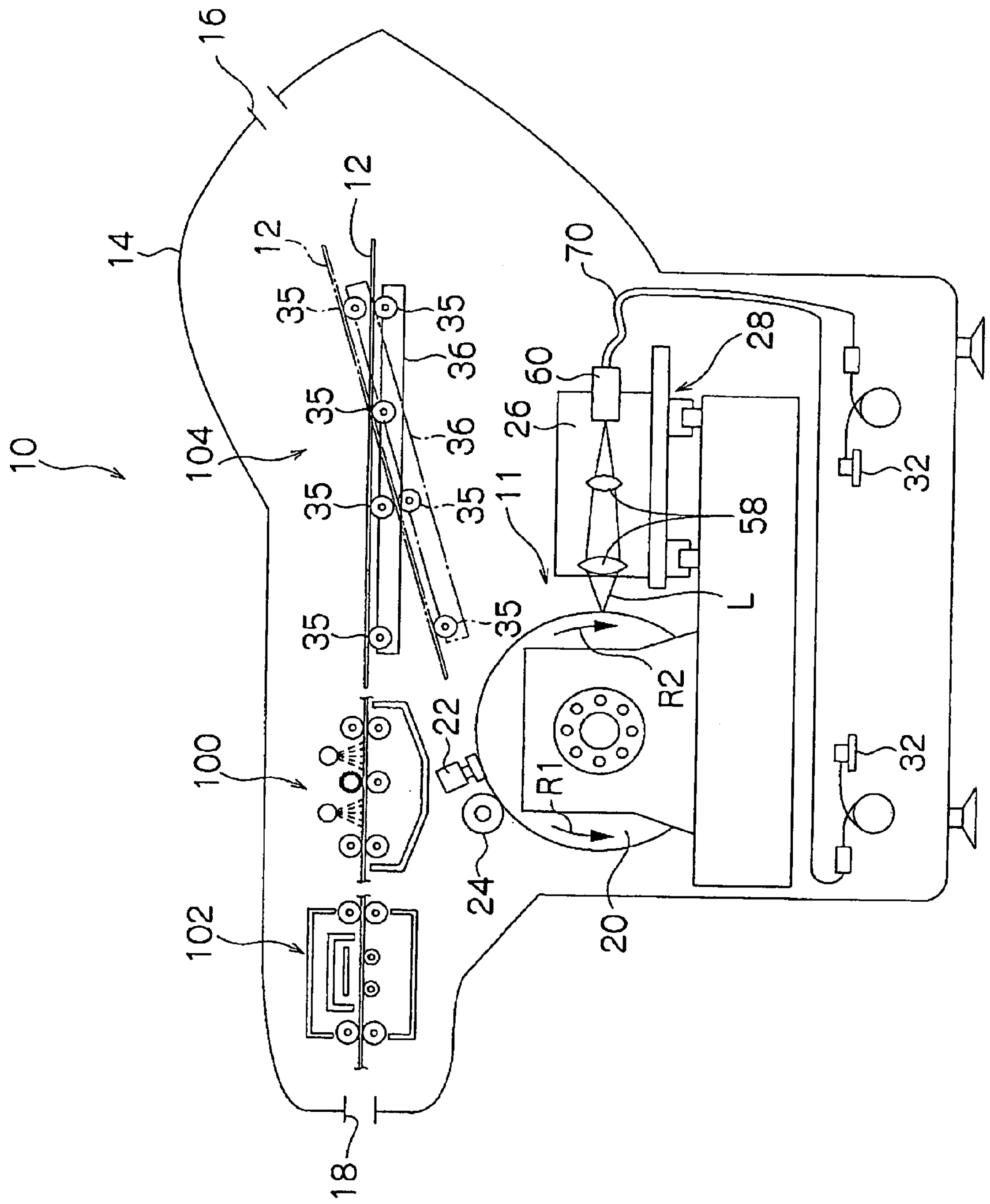
FIG. 1 is a constitutional view showing an overall schematic constitution of an image forming apparatus of an embodiment of the present invention.

FIG. 1 shows an overall schematic constitution of an image forming apparatus of the embodiment of the invention. The image forming apparatus 10 scanning exposes a precursor of a planographic printing plate 12 with an infrared laser (hereinafter, referred to as "IR laser L") modulated on the basis of digital image information, and forms an image (a latent image) corresponding to the digital image information on the precursor of the planographic printing plate 12.

The precursor of the planographic printing plate 12 (hereinafter, may be referred simply to as "planographic printing plate precursor") is a planographic printing plate precursor in which an image recording layer containing a thermally sensitive and thermally curable material is formed on a support. The planographic printing plate precursor used in the invention can be developed by so-called water-developing in which an unexposed part is removed by dispersing or removing thereof in a developer (water or a suitable aqueous solution may be used for a developer) such as water or dampening water generally used in a printer, or the planographic printing plate precursor can be developed on a printer.

The planographic printing plate precursor is provided with an image recording layer (hereinafter may be referred to as "recording layer") formed on the surface of a support made of aluminium or aluminium alloy. The recording layer contains a hydrophobic precursor and a light-to-heat conversion agent.

The image recording layer of the planographic printing plate precursor may contain microcapsules containing a thermal reactive compound, a polymerization initiator, and a light-to-heat conversion agent. Since a polymerization initiator such as a radical initiator or an acid generating agent and a light-to-heat conversion agent may exist respectively in either inside of the microcapsule or outside of the microcapsule, the polymerization initiator and light-to-heat conversion agent may be added to at least inside of the microcapsule or outside of the microcapsule in the recording layer matrix. However, it is preferable that the polymerization initiator may be added to a recording layer matrix from the viewpoint of storage stability. It is preferable that the light-to-heat conversion agent is added to the microcapsule or the outside wall of the microcapsule from the viewpoint of sensitivity.

As shown in FIG. 1, the image forming apparatus 10 is provided with a laser recording part 11, a water developing part 100 and a later heating treatment part 102 in a casing 14 as the outer envelope of the main body. The water developing part 100 leaves an image recording layer part at least the surface layer thereof has been thermally cured by exposure, and performs a simplified water development step of removing an unexposed image recording layer part which has not been thermally cured. The later heating treatment part 102 heats the planographic printing plate carried in the part so that the whole remaining image recording layer part is uniformly cured and firmly fixed on the surface of the aluminum support.

A supply port 16 for supplying the precursor of the planographic printing plate 12 is formed on the casing 14, and a discharge port 18 for discharging the planographic printing plate 12 after the completion of the development is formed at the opposite side to the supply port 16.

In addition, a carrying device 104 for carrying the planographic printing plate 12 in and out, and transporting to carry in is arranged among the supply port 16, the laser recording part 11 and a water developing part 100 in the casing 14.

The carrying device 104 is provided with a plurality of carrying rollers 35 arranged along the carrying route of the planographic printing plate 12 and plate-shaped guide members 36. In the carrying device 104, the precursor of the planographic printing plate 12 can be moved by being rotated between a laser recording part carrying-in carrying-out position for carrying the precursor of the planographic printing plate 12 shown by an imaginary line in FIG. 1 in or out of the laser recording part 11 and a water developing part carrying-in position for carrying the planographic printing plate 12 shown by a solid line in FIG. 1 in the water developing part 100.

Figure 2:
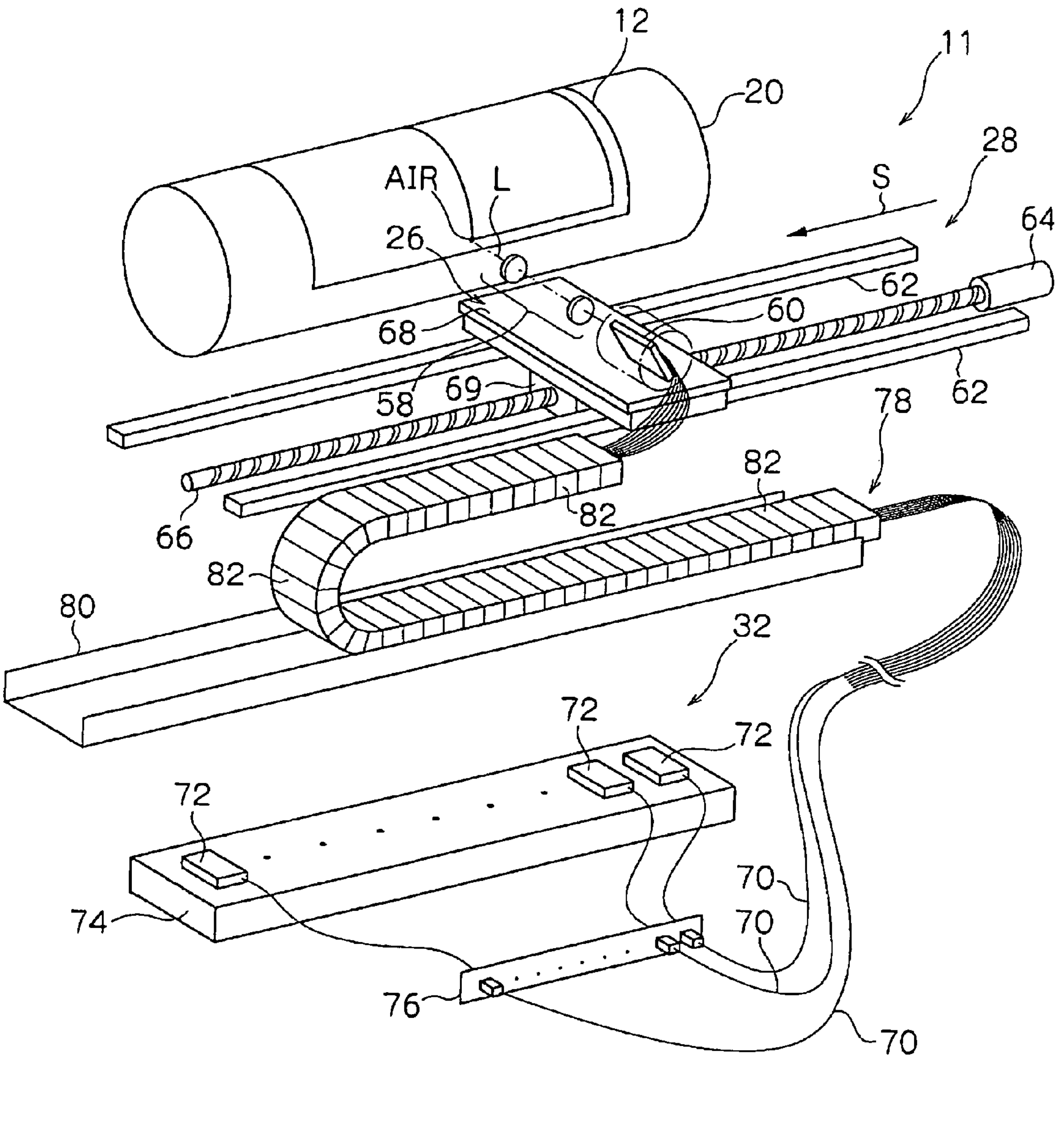
FIG. 2 is a schematic perspective view showing a laser recording part of an image forming apparatus of an embodiment of the invention.

As shown in FIGS. 1 and 2, a columnar outer drum 20 which makes a sheet of planographic printing plate 12 attachable to/detachable is mounted in the rotatably driven state on the laser recording part 11. A chuck mechanism 22 for respectively engaging the tip end part and rear end part of the planographic printing plate 12 with the outer peripheral surface of the outer drum 20 is arranged on the outer peripheral surface of the outer drum 20, and a guide roller 24 for winding the planographic printing plate 12 on the outer peripheral surface of the outer drum 20 is arranged.

An exposure head 26 is arranged on the laser recording part 11 so as to face the outer drum 20. The exposure head 26 is attached so as to enable displacement operation by a transferring mechanism 28 along a subscanning direction. A LD light source device 32 for supplying IR laser L to the exposure head 26 is arranged at the lower position of the outer drum 20 in the casing 14.

As shown in FIG. 2, the exposure head 26 in the laser recording part 11 has a lens unit 58 which consists of a plurality of lenses and composes the imaging optics, a pair of supporting plates which hold the tip parts of a plurality of optical fibers 70, and a fiber holder 60 which consists of a transparent protecting plate or the like for protecting the tip surface of the optical fiber 70.

In the exposure head 26, the IR laser L outgone respectively from a plurality of optical fibers 70 is focused on the precursor of the planographic printing plate 12 attached to the outer drum 20 by the lens unit 58, and the precursor is exposed by the beam spot having a predetermined shape and a size.

The exposure head 26 is a multi beam type, and can project a plurality of beam spots on the precursor of the planographic printing plate 12 at the same time. A plurality of beam spots are arranged along the subscanning direction on the precursor of the planographic printing plate 12, or are arranged on a straight line slightly inclining to the subscanning direction.

As shown in FIG. 2, the other end parts of a plurality of optical fibers 70 connected with the exposure head 26 are respectively connected with a plurality of semiconductor lasers 72 of the LD light source device 32. The semiconductor lasers 72 of the LD light source device 32 are fixed on a plate-shaped heat sink 74. A connector array 76 is arranged at the midway part of the optical fiber 70, and the optical fiber 70 of the fiber holder 60 side can be brought into contact with and separated from the optical fiber 70 of the semiconductor laser 72 side through the connector array 76. As a result, for instance, the semiconductor laser 72 broken can be easily exchanged without decomposing the fiber holder 60 or the like when any of semiconductor laser LD breaks.

The part (tip side) of the exposure head 26 side of the plurality of optical fibers 70 is be inserted into a tubular cable bare 78. The cable bare 78 is composed by link-connecting a lot of link pieces 82 divided along the longitudinal direction in series, and can be curved along the vertical direction.

The cable bare 78 is attached on the underside of a guide rail 62 of the transferring mechanism 28 in a gutter-shaped bare guide 80 arranged so as to extend in the subscanning direction.

The bare guide 80 supports the cable bare 78 from the lower side, and limits the movement of the cable bare 78 in the cross direction. As a result, the tip side part of the optical fiber 70 moved with the exposure head 26 is protected by the cable bare 78 when the exposure head 26 is moved in the subscanning direction, and thereby the optical fiber 70 is prevented from damaging.

The exposure head 26 is mounted on a plate-shaped career 68 in the transferring mechanism 28, and is moved integrally with the career 68 along the subscanning direction (the direction of an arrow S shown in FIG. 2).

The transferring mechanism 28 is provided with a pair of guide rails 62 which slidably support the career 68 along the subscanning direction, and a transferring screw shaft 66 connected with a motor unit 64. A blocky female screw member 69 is fixed to the lower surface part of the career 68, and the screw shaft 66 is screwed into a female screw hole punched in the female screw member 69.

In the transferring mechanism 28, the exposure head 26 integrated with the career 68 is moved by only the distance corresponding to the rotational amount of the screw shaft 66 in the direction (the forward direction or the reverse direction along the subscanning direction) corresponding to the rotating direction of the screw shaft 66 by turning and controlling the screw shaft 66 by the motor unit 64.

The laser recording part 11 exposes the precursor of the planographic printing plate 12 only when the exposure head 26 advances forwards in the subscanning direction.

The laser recording part 11 scanning exposes the precursor of the planographic printing plate 12 attached to an outer drum 20 with IR laser L modulated on the basis of digital image information, and forms the latent image corresponding to the digital image information in the recording layer of the precursor of the planographic printing plate 12.

In the image forming apparatus 10, as described below, the planographic printing plate 12 on which the image is formed is completed by performing water developing treatment and later heating treatment after performing laser exposure to the precursor of the planographic printing plate 12. Therefore, in the laser recording part 11, the precursor of the planographic printing plate 12 can be scanning exposed with laser light (IR laser L) having the amount of relatively weak laser power (amount of light for exposure) capable of curing at least the part (the part of ⅓ or more of the surface side in the thickness direction of the recording layer) of the surface side in the thickness direction of the recording layer of the planographic printing plate 12, and for instance, the half or more of conventional amount of laser power. Therefore, the LD light source device 32 can be produced at low cost since the LD light source device 32 of the laser recording part 11 can expose on comparatively low power. The record speed of the laser recording part 11 can be enhanced since the LD light source device 32 can expose on low power.

As shown in FIG. 1, in the laser recording part 11, the tip end part of the precursor of the planographic printing plate 12 is chucked the outer peripheral surface of the outer drum 20 by the chuck mechanism 22 when the precursor of the planographic printing plate 12 is carried to the vicinity of the upper end part of the outer drum 20 by the carrying device 104, and the outer drum 20 is rotated in a predetermined normal rotating direction (the direction of an arrow R1 shown in FIG. 1). As a result, the precursor of the planographic printing plate 12 of which the tip end part is bound is pressurized on the outer peripheral surface of the outer drum 20 by the guide roller 24, and is wound on the outer peripheral surface of outer drum 20 so as to cohere to the outer peripheral surface.

In the laser recording part 11, when the precursor of the planographic printing plate 12 is wound on the outer peripheral surface of outer drum 20, the rear end part of the precursor of the planographic printing plate 12 is chucked on the outer peripheral surface of the outer drum 20 by the chuck mechanism 22. The whole planographic printing plate 12 is cohered to the outer peripheral surface of the outer drum 20, and wound on the outer peripheral surface. Thereby, the attaching operation of the planographic printing plate 12 to the outer drum 20 is completed.

In this laser recording part 11, in the state that the precursor of the planographic printing plate 12 is wound on outer drum 20, while the exposure head 26 is moved in the subscanning direction by the transferring mechanism 28, the precursor of the planographic printing plate 12 is irradiated with the IR laser L outgone from the exposure head 26, and the sub-scanning exposure is performed to the precursor of the planographic printing plate 12. In the laser recording part 11, a main scan is performed to the precursor of the planographic printing plate 12 by rotating the outer drum 20 by the amount of the rotation corresponding to a main scanning pitch to the normal rotating direction in synchronization with the single sub-scanning completion.

In the laser recording part 11, when exposure (image formation) is completed to the planographic printing plate 12 attached to the outer drum 20 as described above, the outer drum 20 is rotated in the reverse direction (the direction of an arrow R2 shown in FIG. 1), and the rear end part and tip end part of the planographic printing plate 12 are sequentially released from the outer drum 20 by the chuck mechanism 22.

In conjunction with the operation, the carrying device 104 puts the planographic printing plate 12 carried out from the outer peripheral surface of the outer drum 20 on a plurality of carrying rollers 35 attached to the part of the guide member 36 by rotating the carrying rollers 35.

The carrying device 104 is then moved from a laser recording part carrying in-out position shown by an imaginary line in FIG. 1 to a water developing part carrying in position shown by a solid line in FIG. 1, and the planographic printing plate 12 is carried in the water developing part 100.

As shown in FIG. 1, the water developing part 100 is arranged on the upper part of the outer drum 20 in the casing 14 in the image forming apparatus 10.

Figure 3:
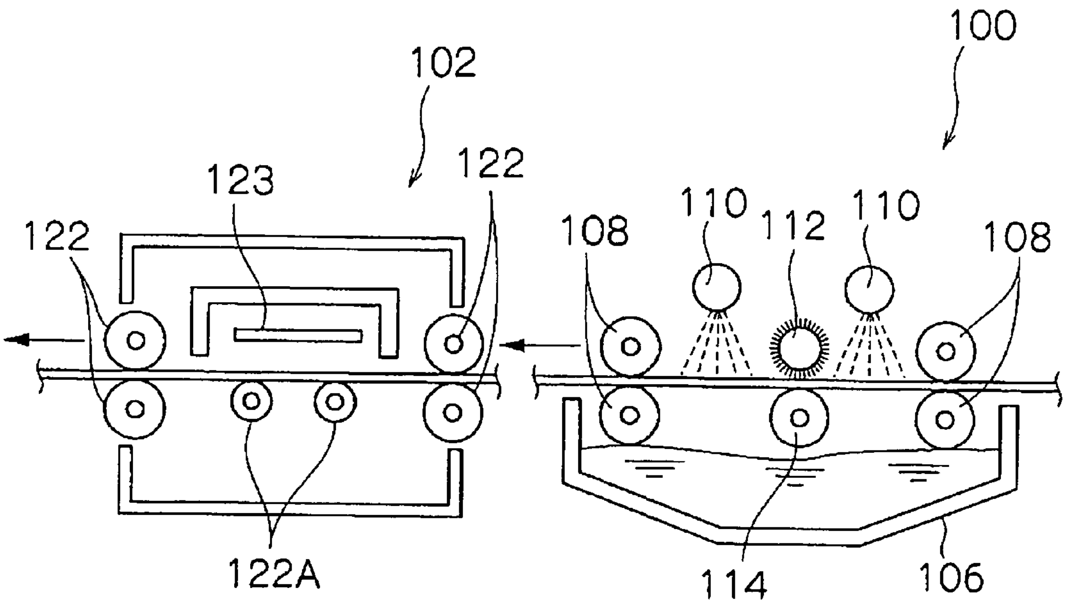
FIG. 3 is an enlarged schematic constitution view showing a water developing part and a later heat treating part of an image forming apparatus of an embodiment of the invention.

As shown in FIGS. 1 and 3, in the water developing part 100, a spray device 110 for jetting a liquid (a suitable aqueous solution may be used for a developer) such as water or dampening water generally used in a printer on the image recording layer of the planographic printing plate 12 is arranged on the upper part of the carrying passage of the planographic printing plate 12 composed by the carrying means in which a plurality of carrying roller pairs 108 on the upper part of a water developing tank 106 are arranged at predetermined intervals.

For instance, the planographic printing plate 12 can be carried at the carrying speed of 120 mm/min by the carrying means for composing the carrying passage of the planographic printing plate 12.

For instance, the spray devices 110 can be composed by arranging a spray pipe along the width direction of the planographic printing plate 12 (the vertical direction to the plane of the drawing of FIG. 1). Although not shown in the drawings, a plurality of discharge ports (not shown) which are formed along the axial direction and are opened toward the upper surface of the planographic printing plate 12 are formed on the spray pipe. The developer in the water developing tank 106 is supplied to the spray pipe by a pump or the like (not shown).

A rotating brush 112 which is rotated and driven by a motor or the like (or, rubber roller) is arranged on the carrying passage of the planographic printing plate 12 composed on the upper part of the water developing tank 106. The rotating brush 112 removes a unexposed part which is not heat-cured by the heat converted from the laser light in the image recording layer of the planographic printing plate 12 when a water development is performed. For instance, the rotating brush 112 can be rotated and driven at the rotating speed of 105 rpm. A so-called channel brush, a pile brush or a molten brush and a rubber roller or the like can be used for the rotating brush 112. The rubber roller is effectively used for the water development (treatment for removing film and developing).

The rotating brush 112 is arranged above the carrying passage, and the carrying roller 114 is arranged closely and directly below the rotating brush 112. The carrying roller 114 supports the planographic printing plate 12 below when the rotating brush 112 is press-contacted and rotated so as to rub the surface of the planographic printing plate 12 with a predetermined strength.

In the water developing part 100 sprays a developer such as water from the spray device 110 on the image forming layer of the planographic printing plate 12 carried on the carrying passage, removes a unexposed part by rubbing the surface of the planographic printing plate 12 with the rotating brush 112 with a predetermined strength to leave only the cured surface part of the image recording layer.

The redundant developer jetted on the planographic printing plate 12 is flown in the water developing tank 106, is filtrated, and is recycled.

In addition, the water developing part 100 may apply jet-spray having strong water flow to the surface of planographic printing plate 12 so as to remove a recording layer (include microcapsule particles) buried in the irregularity of an anode oxidize film as a hydrophilic layer of the aluminium support (aluminium substrate) in the planographic printing plate 12. In this case, for instance, the developer can be jetted from the nozzle arranged on the spray pipe. The rotating brush 112 may be used together when the developer is jetted and applied to the planographic printing plate 12, and performing the water developing process, or the rotating brush 112 may be omitted.

Figure 4:
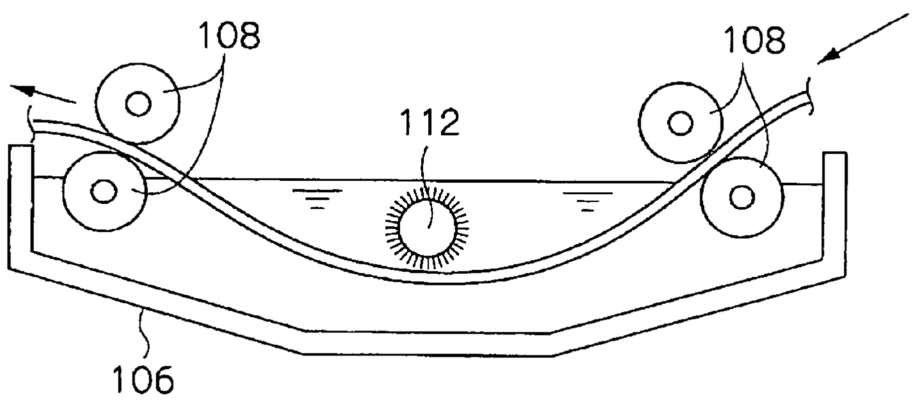
FIG. 4 is an enlarged schematic constitution view showing a water developing part having another construction of an image forming apparatus of an embodiment of the invention.

The water developing part 100 may be composed as illustrated in FIG. 4.

In the water developing part 100 illustrated in FIG. 4, the surface of the planographic printing plate 12 soaked in the developer pooled in the water development tank 106 is rubbed by the rotating brush 112 soaked similarly in the developer. Thereby the unexposed part is removed, and only the part in which the surface side of the recording layer is cured is left (a so-called water development).

Therefore, in the water developing part 100 illustrated in FIG. 4, the carrying passage of the planographic printing plate 12 is set so as to pass in the developer pooled in the water development tank 106. In addition, while the rotating brush 112 arranged so as to be soaked in the developer presses the surface of the planographic printing plate 12, the rotating brush 112 is sunk in the developer, and the surface of the planographic printing plate 12 is rubbed with a predetermined strength by rotating brush 112. Since the constitution, the action and the effect other than the explanation described above in the water developing part 100 illustrated in FIG. 4 are similar to the one shown in FIG. 3, the explanation is omitted.

As shown in FIGS. 1 and 3, a later heating treatment part 102 is arranged on the downstream side of the carrying direction of the planographic printing plate 12 from the water developing part 100.

In the later heating treatment part 102, the part of the lower side (the fixing face side to the aluminium support corresponding to back side of the recording layer) in the thickness direction of the image recording layer existing on the planographic printing plate 12 water-developed is heat-cured.

Therefore, a plurality of carrying rollers 122, 122A are arranged at predetermined intervals so as to compose the carrying passage of the planographic printing plate 12 in the later heating treatment part 102. In addition, a heater 123 as heating means for heating the recording layer of the planographic printing plate 12 to a predetermined heating temperature is arranged above the carrying passage of the planographic printing plate 12. In the later heating treatment part 102, the planographic printing plate 12 carried on the carrying passage is heated from the surface by the heater 123, and the part of the lower side (the fixing face side to the aluminium support corresponding to the back side of the recording layer) in the thickness direction of the image recording layer is sufficiently heat-cured.

Heating means used for the later heating treatment part 102 can composed of a radiation heating such as a halogen heater and a ceramic heater, a heating fan unit which jets hot air from a nozzle, a heat roller which rollingly contacts on the planographic printing plate 12, an infrared rays irradiation, an electromagnetic radiation, and a high-frequency induction radiation.

In addition, the heating means may be feedback-controlled by a heating control part (not shown) in the later heating treatment part 102. In this case, a temperature sensor such as an infrared radiation thermometer which detects the temperature in the part (heating area) heating a heating area in the image recording layer of the planographic printing plate 12 is arranged, and detects the temperature of the heating area (surface temperature) with this temperature sensor, and outputs the measurement signal corresponding to the surface temperature of the heating area to the heating control part (not shown).

The heating control part executes the feed back control of the heating means such that the temperature of the heating area is set to a predetermined temperature based on the measurement signal of the temperature sensor.

When the feed back control of the heating means is executed, the temperature of the heating area can be maintained accurately and stably to a predetermined heating temperature.

In the later heating treatment part 102, the heating temperature for heating the surface of the planographic printing plate 12 is set to a temperature, at which the part of the lower layer side (the fixing face side to the aluminium support corresponding to the back side of the recording layer) in the thickness direction of the image recording layer of the planographic printing plate 12 is sufficiently heat-cured, and a so-called fogging is not caused in the unexposed part of the planographic printing plate 12 when printing.

That the fogging is caused in the unexposed part of the planographic printing plate 12 during printing means following state. The unexposed part of the image recording layer is removed by the water development of the water developing part 100 when exposed the planographic printing plate 12 using the laser recording part 11, and the surface the anodized layer of the aluminium support (hydrophilic surface anodized and roughed) is exposed. The surface of the anode oxidation film exposed is heated by the later heating treatment part 102, and the hydrophilicity is ruined. An ink is put on the part during printing, and the printing is performed in the state that the ink is adhered at the place on which the ink should not be originally adhered.

Since the condition of the heating temperature and heating time in the later heating treatment part 102 is decided by the characteristic of a chemical composition in the image recording layer of the planographic printing plate 12, a proper heating temperature is decided by actually heating at various heating temperatures. For instance, the heating temperature in the heating condition is set to 120° C. to 140° C., and it is heated only for 1 to 10 seconds.

Next, the action and operation of the image forming apparatus 10 described above will be described.

When the image is formed on the planographic printing plate 12 by using the image forming apparatus 10, the precursor of the untreated planographic printing plate 12 is inserted from the supply port 16 of the casing 14 into the image forming apparatus 10.

Then, the precursor of the planographic printing plate 12 is carried into the laser recording part 11 by the carrying device 104, is chucked on the outer peripheral surface of the outer drum 20 by the chuck mechanism 22, and the exposure preparation is completed. Then, the laser recording part 11 forms a latent image by exposing by scanning while irradiating the IR laser L from the exposure head 26 on the precursor of the planographic printing plate 12 (scanning exposure treatment).

The planographic printing plate 12 on which the latent image is formed is opened from the outer drum 20 by the chuck mechanism 22, and is exhausted on the carrying device 104. Then, the carrying device 104 carries the planographic printing plate 12 to the water developing part 100.

In the water developing part 100, the planographic printing plate 12 carried in is water-developed.

The planographic printing plate 12 water-developed in the water developing part 100 is carried on the carrying passage, and is carried in the later heating treatment part 102. Thereby the planographic printing plate 12 on which the image is formed is completed, and is carried out to a tray or the like (not shown) in the outside of the apparatus from the discharge port 18.

The planographic printing plate 12 on which the image is formed is used for printing by attaching to a printer (not shown).

In the above image forming apparatus 10, the laser recording part 11, the developing part 100, and the later heating treatment part 102 are arranged in a casing 14, and apparatus is formed into one piece. However a device having the laser recording part 11, and a device having the water developing part 100 and the later heating treatment part 102 are composed as another device.

The planographic printing plate precursor 12 is exposed by the device having the laser recording part 11. The planographic printing plate 12 on which the latent image is formed is performed by a device having anther water developing part 100 and anther later heating treatment part 102, and the planographic printing plate 12 on which the image is formed is completed.

In addition, if the water development treatment and the heat treatment are continuously performed to the planographic printing plate 12 on which the latent image is formed, the water developing part 100 and the later heating treatment part 102 are composed as separated devices.

Next, the image forming method for the planographic printing plate applied to the image forming apparatus 10 described above will be described in FIGS. 5 to 7.

Figure 5:
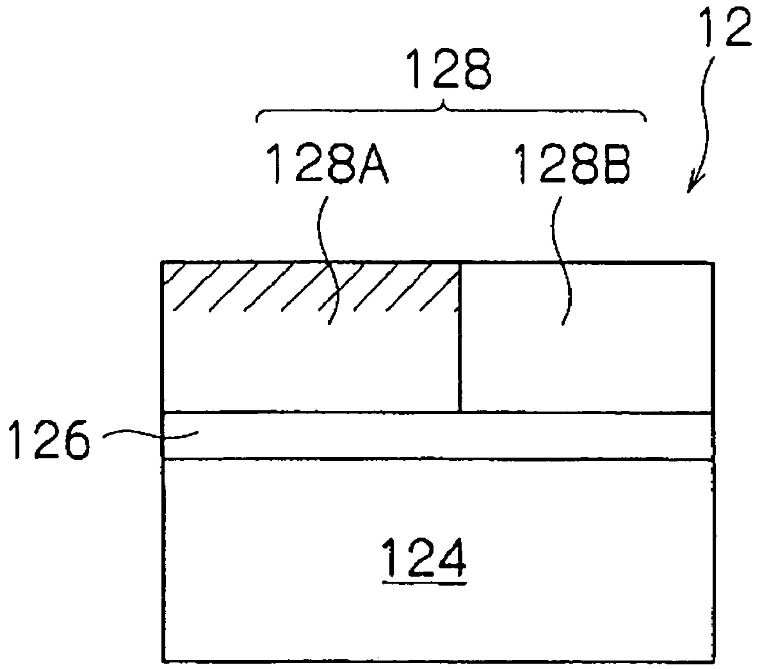
FIG. 5 is an enlarged sectional view showing an essential portion of an exposed planographic printing plate in an image forming method of a planographic printing plate of an embodiment of the invention.

As shown in FIG. 5, in the image forming method for the planographic printing plate, the planographic printing plate 12 in which an anodized layer 126 as the hydrophilic layer is formed on the surface of the aluminium support 124 and the image recording layer 128 is formed on the anodized layer 126 is used.

In the exposure treatment process, the exposure treatment is performed by the laser light (IR laser L) a comparatively weak laser power amount or more (half amount of the conventional laser power) for curing the part (preferably the part of the surface side of ⅓ or more in the thickness direction of the recording layer) of the surface side as at least a surface layer in the thickness direction of the image recording layer 128. A latent image is formed on the precursor of the planographic printing plate 12.

Since the amount of the laser power can be decreased in the exposure treatment, a similar effect as the improvement of the sensitivity of the planographic printing plate 12 as the result is achieved.

As shown in FIG. 5, in the planographic printing plate 12 exposed, the image recording layer part 128A exposed in the part of the image recording layer 128 in the image recording layer part is heat-cured on the part of the surface side, and the unexposed image recording layer part 128B remains as it is as a lipophilic layer which is not cured.

Figure 6:
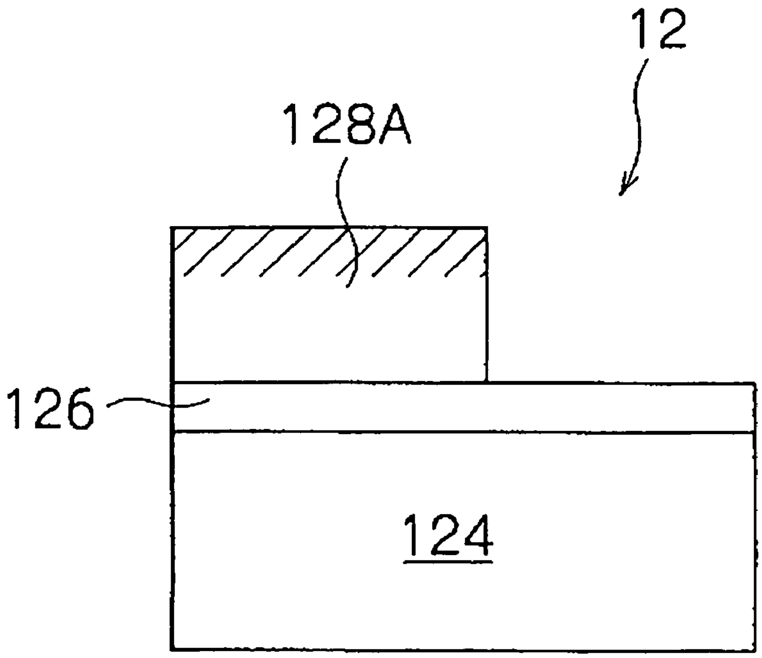
FIG. 6 is an enlarged sectional view showing an essential portion of a planographic printing plate developed by water in an image forming method of a planographic printing plate of an embodiment of the invention.

Next, the exposed planographic printing plate 12 is developed (correspond to the water developing treatment in the water developing part 100 in the above embodiment). As shown in FIG. 6, in the developing treatment, a lipophilic layer as the unexposed image recording layer part 128B in the planographic printing plate 12 is removed. In the developing treatment, the image recording layer part 128A which is exposed and of which the surface in the planographic printing plate 12 is cured is left. The lipophilic layer as the unexposing image recording layer part 128B is removed. Therefore, various means other than the water development treatment can be performed.

Figure 7:
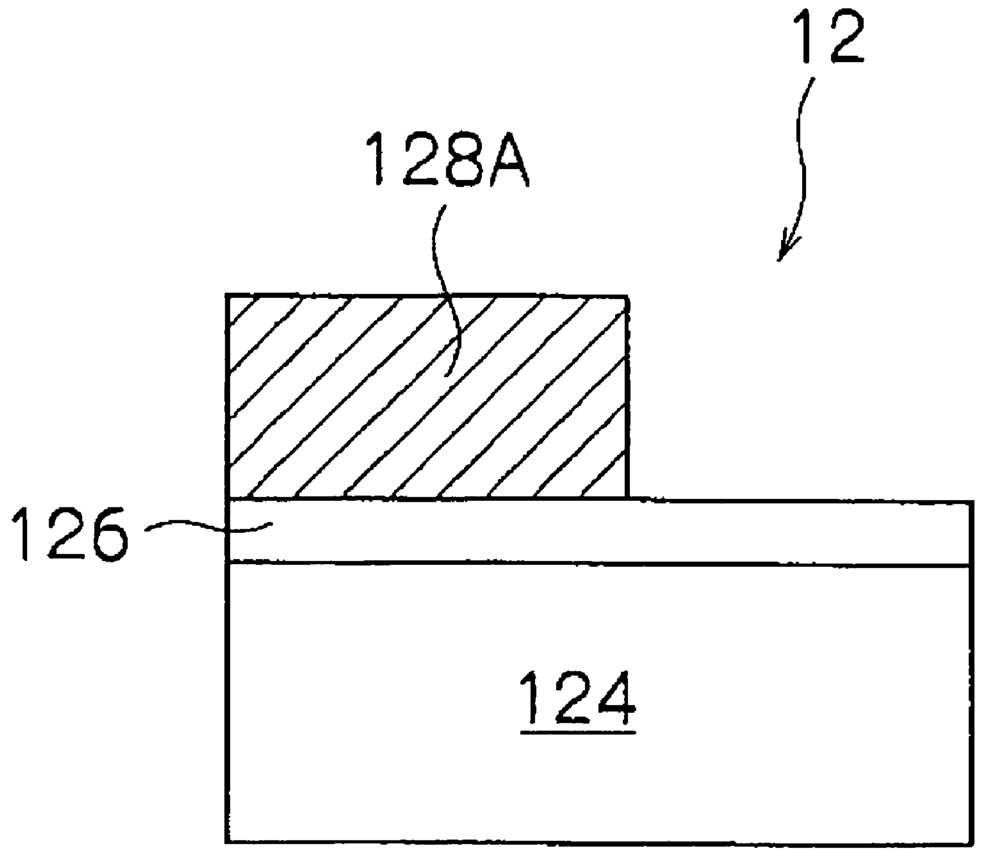
FIG. 7 is an enlarged sectional view showing an essential portion of a planographic printing plate heated in an image forming method of a planographic printing plate of an embodiment of the invention.

Next, the developed planographic printing plate 12 is heated. As shown in FIG. 7, in the heating treatment, the image recording layer part 128A as a lipophilic layer in which only the surface is cured in the planographic printing plate 12 is sufficiently heat-cured. The image recording layer part 128A is firmly fixed on the surface of anodized layer 126, and the whole image recording layer part 128A is uniformly cured.

When the image recording layer part 128A is cured by the laser exposing treatment to the precursor of the planographic printing plate 12, the increase of the strength of the laser light irradiated causes the scattering the surface of the image recording layer part 128A due to ablation. In addition, it is difficult to cure the whole image recording layer part 128A uniformly since the heat is moved to the side of the aluminium support 124 in the part in the vicinity of the anodized layer 126 in the thickness direction of the image recording layer part 128A, and the printing durability of the planographic printing plate 12 obtained is about 500 sheets.

Compared to this, it was confirmed that the printing durability of about 50000 sheets can be remarkably improved in the planographic printing plate 12 which is water-developed and on which the image is formed after exposing the precursor of the planographic printing plate 12 from the experiment.

That is, according to the image forming method of the planographic printing plate as described above, the high printing durability of the planographic printing plate 12 in which the image is formed can be achieved, and a lot of excellent printed materials can be obtained.

Next, the constitution example 1 of the planographic printing plate precursor which can be used in the embodiment related to the image forming method and image forming apparatus of the planographic printing plate of the invention will be described.

CONSTITUTION EXAMPLE 1

[Preparation of Aluminium Support (1) (Preparation of Aluminium Substrate)]

The refining treatment was performed to molten metal of JIS A1050 alloy including aluminium of 99.5% by mass or more, Fe of 0.30% by mass, Si of 0.10% by mass, Ti of 0.02% by mass, and Cu of 0.013% by mass, and the refined molten metal was cast. As the refining treatment, a degassing treatment was performed for removing unnecessary gas such as hydrogen in the molten metal, and a ceramic tube filter treatment was performed. A casting process was performed by a DC casting process. The solidified ingot having the board thickness of 500 mm was shaved from the surface by 10 mm, and so as to prevent a coarse intermetallic compound, and the homogenizing treatment was performed at 550° C. for 10 hours. Next, after the ingot was hot-rolled at 400° C. and was middle-annealed in a continuous annealing furnace at 500° C. for 60 seconds, the aluminium rolling board having the board thickness of 0.30 mm was produced by the cold strip. The centerline average surface roughness Ra after the cold strip was controlled to 0.2 μm by controlling the roughness of a mill roll. Afterwards, the aluminium rolling board was controlled by a tension leveler so as to improve the planarity.

Next, the aluminium rolling board surface was surface-treated so as to be used as the support for the planographic printing plate precursor. First of all, so as to remove the rolling oil existing on the surface of the aluminium board, the aluminium board was degreased at 50° C. for 30 seconds by 10% sodium aluminate aqueous solution. Then, the aluminium board was neutralized at 50° C. for 30 seconds by 30% sulfuric acid aqueous solution, and the desmut treatment was performed.

Next, the surface of the support was made coarse so as to make the adhesion of the support and the sensible heat layer excellent and apply the non-image area water retentivity (a so-called graining treatment). A solution containing nitric acid of 1% by mass and aluminium nitrate of 0.5% by mass was kept at 45° C., and the electrolysis graining treatment was performed by applying anode side electricity quantity of 240 C/dm$^2$ in alternating waveform having current density of 20 A/dm$^2$ and duty ratio of 1:1 by an indirect supply cell while an aluminum web was flown in a aqueous solution. Then, the etching treatment was performed by using a sodium aluminate aqueous solution of 10% by mass at 50° C. for 30 seconds, and the neutralizing treatment and the smut removing treatment were performed by using a sulfuric aqueous solution of 30% by mass at 50° C. for 30 seconds (Aluminium substrate A).

An oxide film was formed on the support by anodizing so as to improve abrasion resistance, chemical resistance and water retentivity. A aqueous solution containing a sulfuric acid of 20% by mass as an electrolyte is used at 35° C. The anodized layer of 2.5 g/m$^2$ was produced by performing the electrolysis treatment in the direct current of 14A/dm$^2$ from an indirect supply cell while the aluminium web was flown in the electrolyte (Aluminium substrate B).

Then, so as to secure the hydrophilicity as the non-image part of the printing plate, the silicate treatment was performed. A aqueous solution containing third silicic acid soda of 1.5% was kept at 70° C., and the aluminium web was flown such that the contact time of the aluminium web is 15 seconds. The adhesion amount of Si washed in water was 10 mg/m$^2$. Ra of the support produced as described above (centerline surface roughness) was 0.25 μm (Aluminium substrate C).

[Preparation of Aluminium Support (2) (Preparation of a Support in which a Heat Hydrophilic Layer is on an Aluminium Substrate)]

45.2 g of methanol silicasol (manufactured by Nissan Chemical Industries, Ltd., a colloid consisting of a methanol solution containing silica particles of 30% by mass having a diameter of 10 nm to 20 nm), 1.52 g of poly 2-hydroxyethyl methacrylate, and 3.2 g of the following infrared absorbing agent (I-32) were dissolved in 240 g of methanol, and the resultant solution was coated on the previously obtained aluminum substrate C by using bar coating. The coated aluminium substrate C was dried at 100° C. for 30 seconds by using an oven. The coating amount was 1.0 g/m$^2$.

(I-32)

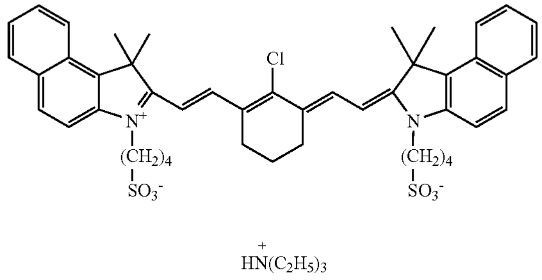

[Preparation of Aluminium Support (3) (Preparation of a Support in which a Heat Insulating Layer is Formed on an Aluminium Substrate and a Heat Hydrophilic Layer is Formed on the Heat Insulating Layer)]

Coating of Heat Insulating Layer 10 g of polyvinyl butyral resin was dissolved in 100 g of methyl ethyl ketone and 90 g of methyl lactate, and the resultant solution was coated on the previously obtained aluminum substrate C by using a bar coating. The coated aluminum substrate C was dried at 100° C. for 1 minute by using an oven. The coating amount was 0.5 g/m$^2$.

Coating of Heat Hydrophilic Layer 45.2 g of methanol silicasol, 1.52 g of poly 2-hydroxyethyl methacrylate, and 3.2 g of infrared absorbing agent (I-32) were dissolved in 240 g of methanol, and the resultant solution was coated on the previously-obtained heat insulating layer by using a bar coating. The coated aluminum substrate C was dried at 100° C. for 30 seconds by using an oven. The coating amount was 1.0 g/m$^2$.

[Synthesis of Microcapsule]

Synthesis of microcapsule (1) of which an outer wall is broken by heat 40 g of xylenediisocyanatohexane, 10 g of trimethylolpropanedidiacrylate, and 10 g of copolymer (molar ratio 60/40) allyl methacrylate and butyl methacrylate (trade name: Pionin A-41C, manufactured by Takemoto Oil & Fat Co., Ltd.) as an oil phase component were dissolved in 60 g of ethyl acetate. 120 g of aqueous solution having PVA205 (trade name, manufactured by Kuraray Co., Ltd.) of 4% by mass was prepared as an aqueous phase component. The oil phase component and the aqueous phase component were emulsified at 10000 rpm by using a homogenizer. Afterwards, 40 g of water was added to the resultant solution, and the solution was stirred at the room temperature for 30 minutes and at 40° C. for 3 hours. The solid content concentration of the microcapsule liquid obtained thus was 20%, and the mean particle diameter of the microcapsule was 0.5 μm.

Synthesis of Microcapsule (2) of which an Outer Wall is Broken by Heat 30 g of isophorone diisocyanate, 10 g of hexamethylene diisocyanate, 20 g of diethylene glycol diglycidyl ether and 0.1 g of Pionin A-41C (trade name, manufactured by Takemoto Oil & Fat Co., Ltd.) as an oil phase component were dissolved in 60 g of ethyl acetate. 120 g of aqueous solution having PVA205 (trade name, manufactured by Kuraray Co., Ltd.) of 4% by mass was prepared as an aqueous phase-component. The oil phase component and the aqueous phase component were emulsified at 10000 rpm by using a homogenizer. Afterwards, water of 40 g was added to the resultant solution, and the solution was stirred at the room temperature for 30 minutes and at 40° C. for 3 hours. The solid content concentration of the microcapsule liquid obtained thus was 20%, and the mean particle diameter of the microcapsule was 0.7 μm.

Synthesis of Polymer Fine Particles Fusible with Heat (Hydrophobic Thermoplastic Polymer Particles) (1) (Have No Reactive Group)

15 g of styrene and 200 ml of polyoxyethylenephenol aqueous solution (concentration $9.84\times10^{-3}$ mol/L) were mixed, and the system was substituted by nitrogen gas while the resultant mixture was stirred at 250 rpm. After the resultant liquid was adjusted to 25° C., 10 ml of cerium (IV) ammonium salt aqueous solution (concentration $0.984\times10^{-3}$ mol/L) was added. At this time, a nitric acid ammonium aqueous solution (concentration $58.8\times10^{-3}$ mol/L) is added, and the pH is adjusted to 1.3 to 1.4. Afterwards, the resultant liquid was stirred for 8 hour. The solid content concentration of the liquid obtained thus was 9.5%, and the mean particle diameter of the microcapsule was 0.4 μm.

Formation of Image Recording Layer

An image recording layer coating solution (1) having the following composition respectively containing microcapsules (1) and (2) synthesized as described above, and polymer fine particles fusible with heat (1) was prepared, and a thermal sensitive layer was formed by applying the coating composition on the aluminum supports (1), (2) and (3) produced as described above respectively.

| | |
|---|---|
| Water | 70 g |
| 1-methoxy-2-propanol | 30 g |
| Microcapsule (1) | 5 g (solid content conversion) |
| Microcapsule (2) | 5 g (solid content conversion) |
| Polymer fine particle fusible with heat (1) | 0.475 g (solid content conversion) |
| Polyhydroxy ethyl acrylate | 0.5 g |
| Sulphate of p-diazophenylamine | 0.3 g |
| infrared absorbing agent (I-32) | 0.3 g |

The coating solution (1) was dried in an oven at 90° C. at 120 seconds after the coating solution (1) for the image recording layer was coated by using bar coating. The coating amount was 0.5 g/m$^2$.

Next, the constitution example 2 of the planographic printing plate precursor which can be used for the image forming method and the image forming method for the planographic printing plate of the invention will be described.

CONSTITUTION EXAMPLE 2

An image recording layer coating solution (2) was dried by an oven on a support which composed as well as the support of the constitution example 1 at 70° C. for 60 seconds after bar-coating the image recording layer coating solution (2) having the following composition to form the image recording layer having the dry coating weight of 0.8 g/m$^2$. Thereby a planographic printing plate precursor was obtained.

Composition of a Coating Solution (2) for Image Recording Layer

| | |
|---|---|
| Water | 55 g |
| Propylene glycol monomethyl ether | 30 g |
| Methanol | 5 g |
| The following microcapsule (3) (solid content conversion) | 5 g |
| Ethoxylated trimethylolpropane triacrylate | 0.2 g |
| (trade name: SR9035, manufactured by Nippon Kayaku Co., Ltd., EO addition mole number 15, molecular weight 1000) | |
| The following polymerization initiator (1) | 0.5 g |
| The following infrared absorbing agent (1) | 0.15 g |
| Fluorine based surface-active agent | 0.1 g |
| (trade name: Megaface F-171, manufactured by Dainippon Ink And Chemicals, Incorporated) | |

Polymerization initiator (1)

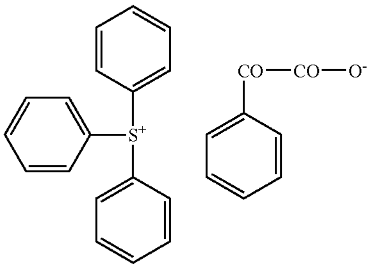

Infrared absorbing agent (1)

-continued

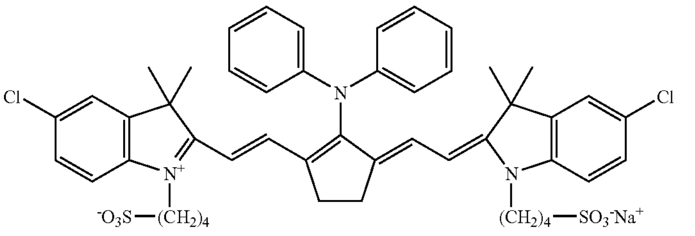

(Synthesis of Microcapsule (3))

As an oil phase component, 10 g of trimethylpropane, xylenediisocyanate adduct (trade name: Takenate D-10N, manufactured by MITSUI TAKEDA CHEMICALS, INC.), 3.15 g of pentaerythritoltriacrylate (trade name: SR444, manufactured by Nippon Kayaku Co., Ltd.), 0.35 g the following infrared absorbing agent (2), 1 g of 3-(N and N-diethylamino)-6-methyl-7-anilinofluoranthene (trade name: ODB, manufactured by Yamamoto Kasei), and 0.1 g of Pionin A-41C (trade name, manufactured by Takemoto Oil & Fat Co., Ltd.) were dissolved in 17 g of ethyl acetate. An aqueous solution of 40 g containing PVA-205 of 4% by mass was prepared as an aqueous phase component. The oil phase component and the aqueous phase component were mixed, and the mixture was emulsified for 10 minutes at 12000 rpm using a homogenizer. The emulsion obtained was added to 25 g of distilled water, and after stirring the resultant mixture for 30 minutes at the room temperature, the mixture was stirred for 3 hours at 40° C. The thus-obtained microcapsule liquid was diluted by using the distilled water such that the solid content concentration of the microcapsule liquid was set to 20% by mass. The mean particle diameter of the microcapsule was 0.3 μm.

Infrared absorbing agent (2)

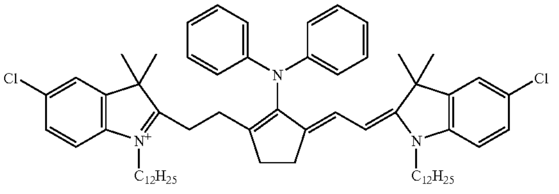

The planographic printing plate precursor which can be used for the embodiment related to the image forming method and the image forming apparatus for the planographic printing plate of the invention is not limited to the constitution example of the planographic printing plate precursor described above. For instance, laser light was irradiated on comparatively low power and exposure treatment was performed by using various planographic printing plate precursors described in Japanese Patent Application Laid-Open (JP-A) Nos. 2001-277740 and 2001-277742, or a thermal recording type (heat mode) planographic printing plate precursor in which a film-shaped image recording layer containing a hydrophobic precursor and a light-to-heat conversion agent on a support capable of being generally used for an on press development system is formed. Thereby the image can be excellently formed, and the printing durability can be improved.

Herein, the thermal recording type (heat mode) planographic printing plate precursor includes the following. The hydrophilic image forming layer is formed on the hydrophilic support, the heat mode exposure is imagewise performed. The dissolubility and dispersibility of the hydrophilic layer are changed, and the unexposed part is removed by a wet development if necessary.

For instance, in the thermal recording type planographic printing plate precursor which can be applied to the invention, a thermoplastic resin particle layer is made ink acceptability by cohereing the layer on the support by a heat. In detail, a photothermal conversion type planographic printing plate precursor having an image forming element containing hydrophobic thermoplastic polymer particles and the light-to-heat conversion agent which can be fused under the influence of heat and is dispersed in a hydrophilic bond material, or a planographic printing plate precursor having a self dispersing thermoplastic polymer particle can be used.

What is claimed is:

1. An image forming method for a planographic printing plate in which an image recording layer containing a thermally sensitive and thermally curable material is formed on an aluminium support, the method comprising:

an exposure step of scanning exposing a planographic printing plate precursor with a laser beam so as to form a latent image in only an upper portion of the image recording layer, where the upper portion is approximately one third of the image recording layer in a thickness direction;

a simplified water development step of leaving an image recording layer part in which the upper portion has been thermally cured by exposure and removing an unexposed image recording layer part which has not been thermally cured, in the planographic printing plate in which the latent image has been formed, and a heating step of heating the planographic printing plate after the simplified water development step such that the whole image recording layer part remaining on the surface of the aluminum support is uniformly cured and firmly fixed to the surface of the aluminum support.

2. An image forming method for a planographic printing plate according to claim 1, wherein the scanning exposure in the exposure step is performed with an infrared laser.

3. An image forming method for a planographic printing plate according to claim 1, wherein the planographic printing plate precursor is a thermal recording type planographic printing plate precursor.

4. An image forming method for a planographic printing plate according to claim 3, wherein the image recording layer of the planographic printing plate precursor contains a hydrophobic precursor and a light-to-heat conversion agent.

5. An image forming method for a planographic printing plate according to claim 3, wherein the image recording layer of the planographic printing plate precursor contains hydrophobic thermoplastic polymer particles.

6. An image forming method for a planographic printing plate according to claim 3, wherein the image recording layer of the planographic printing plate precursor contains microcapsules containing a thermal reactive compound, a polymerization initiator, and a light-to-heat conversion agent.

7. An image forming method for a planographic printing plate in which an image recording layer containing a thermally sensitive and thermally curable material is formed on an aluminium support, the method comprising:

exposing a planographic printing plate precursor by scanning with a laser beam so as to form a latent image only in a portion of the image recording layer in a thickness direction;

developing the image recording layer by allowing an exposed image recording layer part in which the portion has been thermally cured by said exposure to remain and by removing an unexposed image recording layer part which has not been thermally cured, in the planographic printing plate in which the latent image has been formed, and uniformly curing the remaining exposed image recording layer part and firmly fixing the part to the surface of the aluminum support by heating the planographic printing plate, wherein during the exposing, the latent image is formed in approximately one third of the image recording layer in the thickness direction and wherein the remaining portion of the image recording layer in the thickness direction is cured during said heating.

* * * * *